United States Patent [19]

Lade et al.

[11] 4,185,253
[45] Jan. 22, 1980

[54] TEMPERATURE SENSITIVE RELAXATION OSCILLATOR

[75] Inventors: Robert W. Lade, Waukesha; Stanley V. Jaskolski, Sussex; Gordon B. Spellman, Mequon; Herman P. Schutten, Elm Grove, all of Wis.

[73] Assignee: Eaton Corporation, Cleveland, Ohio

[21] Appl. No.: 946,178

[22] Filed: Sep. 27, 1978

[51] Int. Cl.² ............................ G01K 7/00; H03K 3/35
[52] U.S. Cl. ................................. 331/66; 73/362 SC; 307/310; 331/107 R; 331/111; 340/598
[58] Field of Search ................. 331/66, 107 R, 111; 73/342, 362 SC; 340/595, 598; 307/310

[56] References Cited

U.S. PATENT DOCUMENTS

| 3,079,484 | 2/1963 | Shockley et al. | 357/28 X |
|---|---|---|---|
| 3,251,004 | 5/1966 | Shombert et al. | 331/66 X |
| 3,339,085 | 8/1967 | Schmid et al. | 331/111 X |
| 3,933,046 | 1/1976 | Ebrecht | 331/66 X |
| 3,971,056 | 7/1976 | Jaskolski et al. | 357/28 |

*Primary Examiner*—Siegfried H. Grimm
*Attorney, Agent, or Firm*—Hugh R. Rather; William A. Autio

[57] ABSTRACT

A temperature sensitive thyristor is incorporated in a relaxation oscillator to provide active temperature sensing. As temperature decreases, the breakover voltage $V_{BO}$ of the thyristor increases, and when $V_{BO}$ becomes greater than the supply voltage, oscillations will cease, thus providing a low temperature alarm point. As temperature increases, $V_{BO}$ decreases and the amplitude of oscillation diminishes, thus providing a high temperature alarm point. This is a "fail-safe" arrangement because component failure also provides a warning condition (absence of oscillation). Frequency of oscillation may also be sensed as an indication of temperature.

4 Claims, 4 Drawing Figures

TEMPERATURE SENSITIVE RELAXATION OSCILLATOR

BACKGROUND OF THE INVENTION

Relaxation oscillators are known in the art. The present invention relates to an improvement thereupon for use in the area of active temperature sensing.

SUMMARY OF THE INVENTION

An object of the present invention is to provide an active temperature sensor comprising a relaxation oscillator in combination with a thermally sensitive thyristor.

Another object is to provide an active temperature sensor which can easily be monolithically integrated.

Another object is to provide an active temperature sensor which "fails safe" so that component failure also provides a warning condition.

Another object is to provide an active temperature sensor which is especially adaptable for use in applications having DC power supplies, for example the automotive field.

Another object is to provide an oscillatory output signal whose amplitude and/or frequency is a function of temperature.

Another object is to provide a digital indication of a sensed analog temperature condition, without an A/D (analog to digital) converter.

Other objects and advantages will hereinafter appear.

DESCRIPTION OF THE PREFERRED EMBODIMENT

Figure 1:
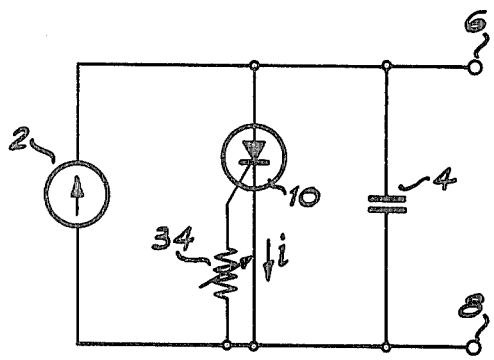
FIG. 1 is a circuit diagram of a relaxation oscillator using a thermally sensitive thyristor.

Referring to FIG. 1, a constant current source 2 is connected across a capacitor 4. The voltage V across terminals 6 and 8 at time t is given by $$V(t) = V(o) + (I/C) t$$

where V(o) is the initial starting voltage, I is the constant current delivered by source 2, and C is the capacitance of capacitor 4.

A thermally sensitive thyristor 10 is connected in parallel with the capacitor. This thyristor may be like that disclosed in U.S. Pat. No. 3,971,056, issued July 20, 1976, to Jaskolski et al, or disclosed in U.S. Pat. No. 4,112,408, issued Sept. 5, 1978 to Jaskolski et al, hereby incorporated herein by reference, which describe a thyristor thermally actuatable to intrinsically switch between high and low resistance states in response to a predetermined switching temperature. Thus, the capacitor charges linearly until $V(t) = V_{BO}$, the forward breakover voltage of the thyristor. At this time the thyristor turns on and the capacitor discharges through it until the discharge current is less than the holding current of the thyristor, after which the thyristor turns off and the capacitor begins charging again.

Figure 2:
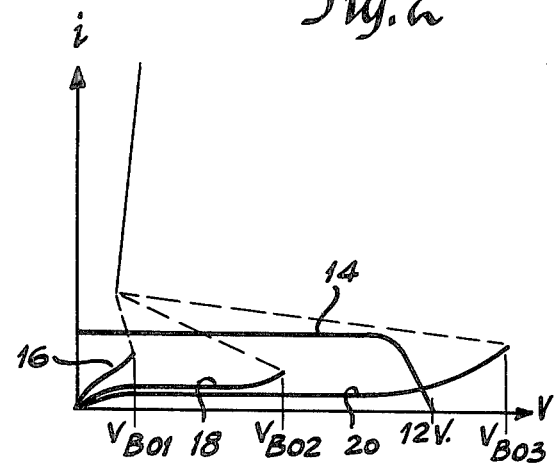
FIG. 2 is a graph of voltage versus current for various temperatures of a thermally sensitive thyristor.

If the current source is replaced by an equivalent 12 volt supply and common base transistor stage, e.g. for automotive applications, the thyristor load curve 14 becomes that shown in FIG. 2. Curves 16, 18 and 20 show the current switching characteristic of thyristor 10 at various temperatures wherein the voltage V across the thyristor is plotted on the horizontal axis and current i through the thyristor is plotted on the vertical axis. When the voltage V applied across the thyristor exceeds its breakover voltage $V_{BO}$, the thyristor abruptly switches (shown by dashed line) to its low resistance, high current on state. Three different values of $V_{BO}$ are shown corresponding to three different temperatures.

As long as $V_{BO}$ is less than 12 volts, for example $V_{BO2}$, the load curve intersects the thyristor curve in the negative resistance region (dashed line), and since capacitor 4 is present, astable oscillations will occur. If the temperature decreases, $V_{BO}$ increases as taught in said patents. When $V_{BO}$ increases to a value about equal to or greater than the supply voltage, for example $V_{BO3}$, FIG. 2, oscillation ceases, thus providing a low temperature alarm point. When temperature increases, $V_{BO}$ decreases, for example to the value $V_{BO1}$, FIG. 2, and the amplitude of oscillation diminishes which can, in conjunction with standard limiting circuitry to be presently described, provide a high temperature alarm point.

Figure 3:
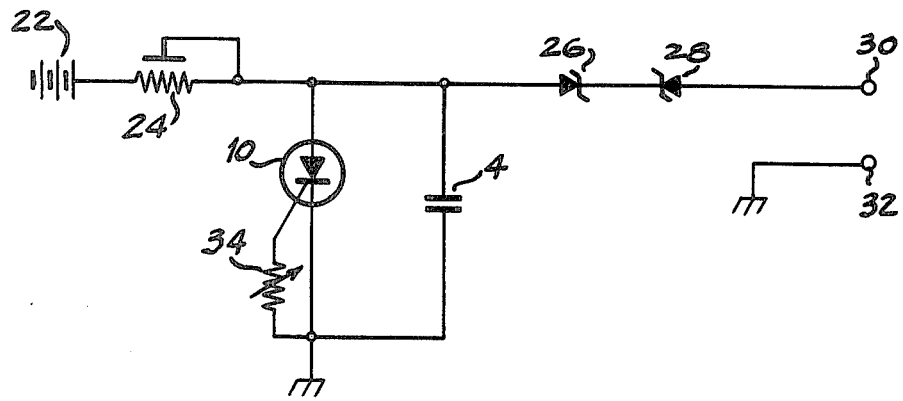
FIG. 3 is an alternate embodiment providing both low and high temperature alarm points.

Referring to FIG. 3, a 12 volt supply 22 is connected to the parallel thyristor and capacitor through a pinch resistor 24 for enabling constant current. A pair of back to back zener diodes 26 and 28 presents a threshold above which the output must rise before any voltage appears across terminals 30 and 32. These zeners limit or clip the amplitude of oscillation such that only those oscillations having an amplitude greater than a designated value will appear at 30 and 32. Thus, oscillations of diminished amplitude, for example at $V_{BO1}$, FIG. 2, will not appear at 30 and 32, whereby to provide a high temperature alarm point.

By setting $V_{BO}$ and the zener values to appropriate levels, there is thus provided an arrangement wherein an operating range of temperatures is established, above and below which by virtue of lack of oscillatory output signal a monitoring system may be notified. This is a "fail safe" arrangement since component failure also provides a warning condition (no signal).

The embodiment described is exemplary. There are numerous other manners of providing current sources, numerous other manners of sensing amplitude besides clipping or limiting, etc. Variable resistor 34 is shown for varying $V_{BO}$ at a given temperature.

Figure 4:
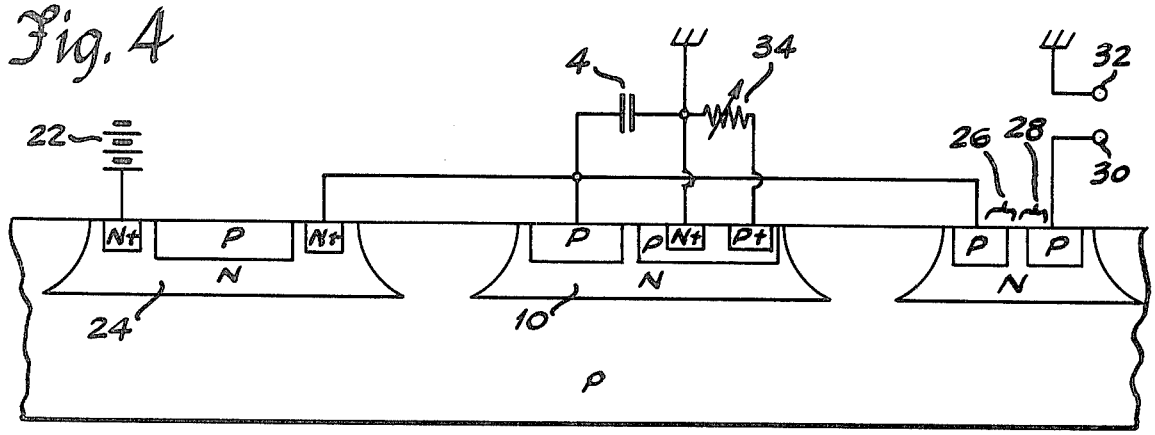
FIG. 4 is a substrate diagram showing monolithic integration of the circuit in FIG. 3.

Except for capacitor 4, all components may be fabricated monolithically on a single chip. If high frequencies can be tolerated, then capacitor 4 can also be integrated using standard MOS techniques. FIG. 4 shows bipolar integration of the circuit of FIG. 3.

Besides sensing amplitude of the oscillatory output signal, the present invention also comprises sensing the frequency of the oscillatory output signal. The higher the temperature, the lower the breakover voltage of the thyristor which in turn requires less charging time of capacitor 4 and thus increased frequency of oscillation. Resistor 34 can be used for tuning purposes. Decreasing the value of resistance 34 increases the requisite breakover voltage at a given temperature which means that the thyristor will switch later, and hence the frequency of oscillation is decreased. Conversely, a higher value of variable resistor 34 increases the frequency of oscillation of the output signal. A frequency sensor may be connected across terminals 30 and 32, with or without zeners 26 and 28.

Such frequency sensor may comprise a digital pulse counter which would provide a digital indication of the analog temperature of the thyristor. The counter can count the number of pulses (firings of thyristor 10) occuring over a given length of time; or the counter can count clock pulses between firings of thyristor 10 as a measure of the period, which is the reciprocal of the frequency. The combination functions as a digital temperature transducer to measure the temperature of the environment in which the thyristor is placed, without a conventional A/D converter.

As a further example, the frequency sensor may comprise a ratemeter such as disclosed in allowed U.S. Pat. No. 4,093,850 Karnowski et al, hereby incorporated herein by reference.

It is recognized that various modifications are possible within the scope of the appended claims.

What is claimed is:

1. A temperature sensor comprising in combination:
a capacitor;
a thermally sensitive thyristor connected in parallel with said capacitor;
a current source connected in series with the parallel combination of said capacitor and said thermally sensitive thyristor to charge said capacitor until the voltage thereacross equals the breakover voltage of said thyristor, whereafter said capacitor discharges through said thyristor until the discharge current is less than the holding current of said thyristor, whereafter said capacitor is recharged, whereby the voltage across said parallel combination comprises an oscillatory output signal;
said breakover voltage increasing with decreasing temperature of said thyristor such that at a given low temperature said breakover voltage exceeds the maximum value of voltage applied across said thyristor whereby oscillation of said output signal ceases, whereby to afford a warning of said low temperature;
said breakover voltage decreasing with increasing temperature so as to require less charging of said capacitor whereby to diminish the amplitude of said oscillatory output signal, and thus afford a warning of high temperature; and
clipping means connected to said parallel combination and having a designated threshold level whereby to establish an operating range of temperatures of said thyristor above and below which no oscillatory signal appears at the output of said clipping means.

2. The invention according to claim 1 comprising a constant current source.

3. The invention according to claim 2 wherein said constant current source comprises a direct current supply and resistor means, and said clipping means comprises at least one zener diode.

4. The invention according to claim 3 wherein said resistor means comprises a pinch resistor comprising a transistor, and wherein said transistor, said thyristor and said at least one zener diode are monolithically integrated on a common substrate.

* * * * *